United States Patent [19]

Wiesgickl

[11] Patent Number: 4,667,147
[45] Date of Patent: May 19, 1987

[54] INDUCTIVE PROXIMITY SWITCH

[75] Inventor: Bernhard Wiesgickl, Vilseck, Fed. Rep. of Germany

[73] Assignee: Siemens Aktiengesellschaft, Fed. Rep. of Germany

[21] Appl. No.: 847,401

[22] Filed: Apr. 1, 1986

[30] Foreign Application Priority Data

Apr. 24, 1985 [DE] Fed. Rep. of Germany ....... 3514833

[51] Int. Cl.[4] .......................... H02J 3/12; G08B 13/26
[52] U.S. Cl. .................................... 323/323; 340/562; 361/181
[58] Field of Search ............... 323/323, 324, 326, 340; 340/561, 562, 563, 564, 568; 331/65, 117 R; 328/5; 361/180, 181

[56] References Cited

U.S. PATENT DOCUMENTS

| | | | |
|---|---|---|---|
| 3,350,660 | 10/1967 | Engdahl | 361/180 |
| 4,204,160 | 5/1980 | Voll | 331/65 |
| 4,366,473 | 12/1982 | Inoue et al. | 340/564 |
| 4,475,089 | 10/1984 | Kahnke | 331/65 |
| 4,553,040 | 11/1985 | Truper | 361/180 |
| 4,583,006 | 4/1986 | Okada et al. | 361/180 |

FOREIGN PATENT DOCUMENTS

| | | |
|---|---|---|
| 1966178 | 1/1972 | Fed. Rep. of Germany . |
| 2113556 | 9/1972 | Fed. Rep. of Germany . |
| 1966178 | 5/1977 | Fed. Rep. of Germany . |
| 7139073 | 5/1972 | France . |
| 2164217 | 3/1986 | United Kingdom ................ 361/180 |
| 2165651 | 4/1986 | United Kingdom ................ 361/180 |

OTHER PUBLICATIONS

German Publication, Der Electroniker, No. 6, 1975, article "Theorie and Anwendungen des Phase-Locked Loops".

Primary Examiner—Peter S. Wong
Assistant Examiner—Judson H. Jones
Attorney, Agent, or Firm—Volker R. Ulbrich

[57] ABSTRACT

This invention concerns an inductive proximity switch having an oscillator and a resonant circuit which is dampable by outside objects, as well as an electronic switch controllable by the voltage across the resonant circuit. From the signal of the electronic switch a switching hysteresis is derived. A device for changing the frequency, when the resonant circuit is damped, as a function of the signal of the electronic switch allows the adjustment of the hysteresis in such a way that there is essentially no effect on the sensitivity of the oscillator.

4 Claims, 2 Drawing Figures

INDUCTIVE PROXIMITY SWITCH

FIELD OF THE INVENTION

This invention relates to an inductive proximity switch having an oscillator in combination with a resonant circuit, dampable from outside, and having an electronic switch controllable by the oscillator-resonant circuit combination, from the signal of the electronic switch a switching hysteresis is provided.

BACKGROUND OF THE INVENTION

In a proximity switch known from Federal Republic of Germany Patent No. 19 66 178, a series circuit consisting of an auxiliary resistance, a diode, and the collector-to-emitter voltage of a control transistor is connected in parallel to the emitter resistance of an oscillator transistor, which has a resonant circuit connected to its collector, in order to form a switching hysteresis. While a switching hysteresis can be achieved by this means, dependent on the switching state of the proximity switch, adjustment of the hysteresis, however, automatically changes the sensitivity of the proximity switch as well. Through an adjustment of the hysteresis the switch range and thereby the sensitivity is influenced. The hysteresis is adjusted through changes in the auxiliary resistance and the switch range is adjusted through changes in the emitter resistance. Since the auxiliary resistance and emitter resistance lie practically parallel, a change in the emitter resistance does not only cause a change in the switch range but also a change in the hysteresis and vice versa.

SUMMARY OF THE INVENTION

It is an object of this invention to provide an inductive proximity switch which, according to the present state of the art, can be adjusted over a relatively wide range with a switching hysteresis, but in which any such adjustment has essentially no effect on the sensitivity of the oscillator or of the inductive sensor coil portion of the resonant circuit.

Briefly stated in accordance with one aspect of the invention, the aforementioned objects may be achieved by providing an inductive proximity switch having a resonant circuit dampable from the outside, an oscillator connected across the resonant circuit, and an electronic switch controllable by a voltage across said resonant circuit. An output signal of the electronic switch provides the proximity switch switching hysterisis characteristic. The proximity switch also comprises a frequency changing device switchably connected to the oscillator when the resonant circuit is damped, as a function of the electronic switch output signal.

BRIEF DESCRIPTION OF THE DRAWING

While the specification concludes with claims particularly pointing out and distinctly claiming the subject matter which is regarded as the invention, it is believed that the invention will be better understood from the following description of the preferred embodiment taken in conjunction with the accompanying drawings in which:

DESCRIPTION OF A PREFERRED EMBODIMENT

Figure 1:
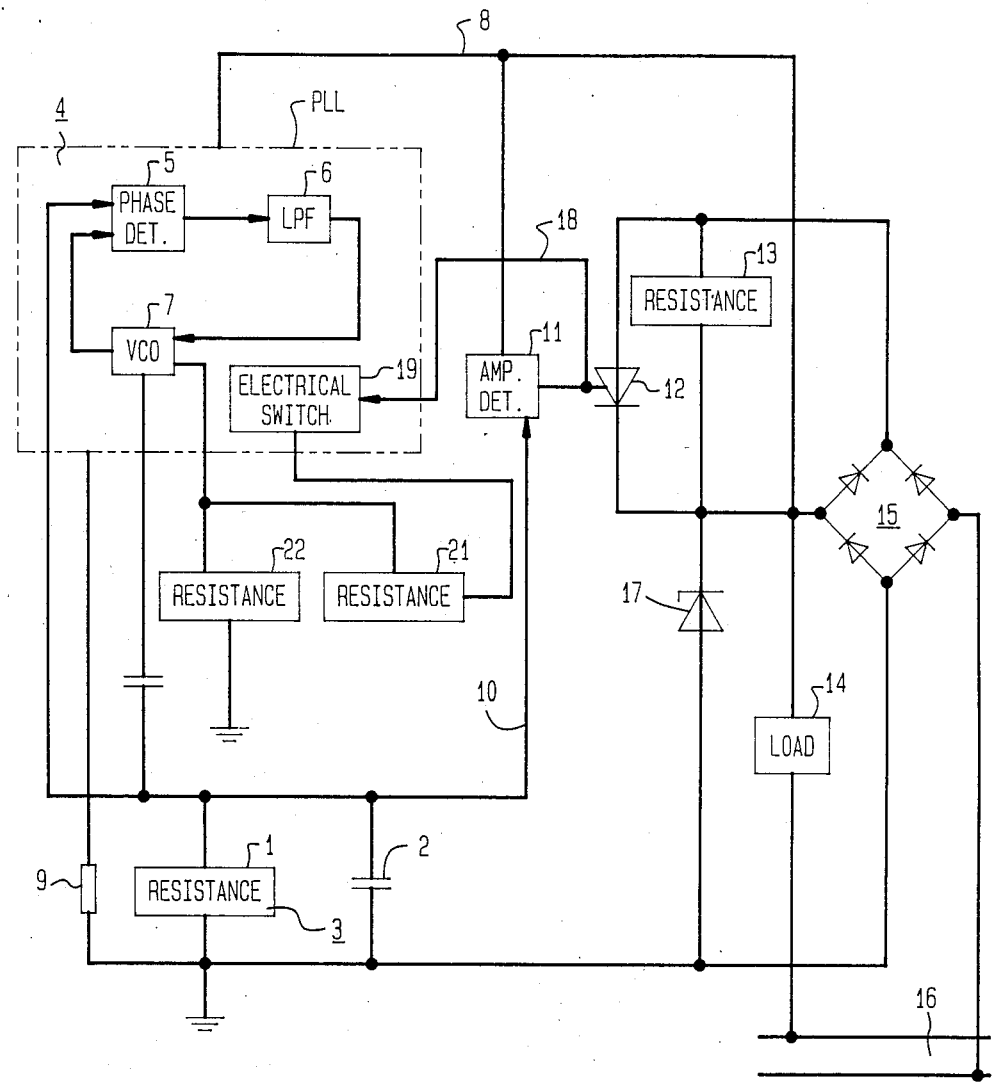
FIG. 1 is a schematic diagram of a preferred embodiment of the invention.

The circuit arrangement for the proximity switch, shown schematically in FIG. 1, consists of a resonant circuit 3. consisting of an inductive proximity coil 1 and a capacitor 2. To this resonant circuit, a phase-locked-loop, PLL, 4 is connected as shown in the journal "Der Elektroniker." No. 6, 1975, page EL 11. The phase-locked-loop consists of the phase detector 5, the loop filter 6 and the voltage-controlled oscillator, VCO, 7. power is supplied to the phase-locked-loop 4 through the line 8 and the resistance 9. The line 10 is connected to an amplitude detector 11, which in turn controls an electronic switch 12, preferably a thyristor. The electronic switch 12 short-circuits the resistance 13 when the phase-locked-loop voltage controlled oscillator-resonant circuit combination is damped, so that the load 14 can be connected to the line 16 through the rectifier bridge 15. The resistance 13 is part of the power supply circuit, consisting of Zener diode 17 and resistance 13, which supplies the voltage for the phase-locked loop 4 and the amplitude detector 11.

A resistance 21 is placed in the circuit or removed from the circuit by the control terminal 18 of the electronic switch 12, through a further electronic switch 19; in this way, the VCO frequency is varied as a function of the switching state of the proximity switch. The non-damped frequency $f_{ent}$, is adjusted by means of the resistance 22.

Figure 2:
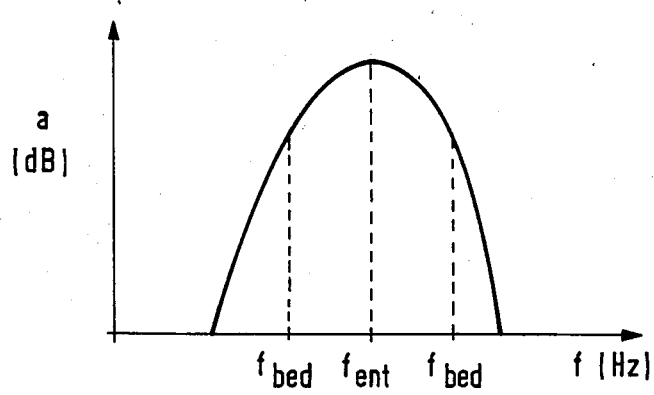
FIG. 2 is a gain versus frequency graph representing the transfer function of the embodiment shown in FIG. 1.

FIG. 2 shows the transfer function of the resonant circuit 3. Starting with the oscillator and the proximity switch in the non-damped condition with the frequency at $f_{ent}$, the proximity switch is subsequently damped. This results in a change in the VCO frequency, as described above, and a different frequency is imposed on the proximity switch as a result of the damping. Said damped frequency is designated $f_{bed}$ and can be higher or lower than $f_{ent}$, as selected. At the frequency $f_{bed}$, the transfer function of the resonant circuit has higher damping so that a hysteresis appears as a result of this additional damping. The selection of the hysteresis can be determined by the freguency $f_{bed}$. As a result of the use of the phase-locked loop 4, which can be employed for the generation of the non-damped as well as the damped frequencies in the illustrated embodiment, these frequencies are kept relatively constant. The effect of temperature drift is likewise compensated by the phase-locked loop with the voltage controllable oscillator, VCO.

The circuit illustrated in FIG. 1 is particularly advantageous in that practically no separate expenditure is required for the creation of the hysteresis where PLL integrated circuits are presently existent in some proximity switches anyway. The PLL circuit could be implemented in a single IC package with the amplitude detector and the switching element. The hysteresis is adjustable in accordance with the switching interval adjustment of the inductive proximity sensor. If, for example, the resistance 21 illustrated in FIG. 1 is a potentiometer, then the hysteresis is adjustable by the user, and since this adjustment is electrically independent of the inductive proximity coil, this adjustment does not influence the proximity switch sensitivity.

It will now be understood that there has been disclosed an improved system for changing the operating frequency of an inductive proximity switch without changing the sensitivity. As will be evident from the foregoing description, certain aspects of the invention are not limited to the particular details of the examples illustrated, and it is therefore contemplated that other modifications or applications will occur to those skilled in the art. It is accordingly intended that the claims shall cover all such modifications and applications as do not depart from the true spirit and script of the invention.

What is claimed as new and desired to be secured by Letters Patent of the United States is:

1. An inductive proximity switch having a resonant circuit dampable by external objects, an oscillator connected across said resonant circuit, and an electronic switch controllable by a voltage across said resonant circuit; an output signal of said electronic switch providing a switching hysteresis characteristic, said proximity switch further comprising a frequency changing device connected to the oscillator when the resonant circuit is damped, as a function of the signal of the electronic switch.

2. A proXimity switch according to claim 1, wherein the oscillator is a phase-locked-loop circuit including a voltage controlled oscillator portion which can be switchably controlled to a different frequency.

3. A proximity switch according to claim 1, wherein the switch to a different frequency is controlled by switchably connecting a resistance.

4. A proximity switch according to claim 2, wherein the switch to a different frequency is controlled by switchably connecting a resistance.

* * * * *